United States Patent
Matsui

(10) Patent No.: US 8,149,632 B2
(45) Date of Patent: *Apr. 3, 2012

(54) OUTPUT CIRCUIT FOR A SEMICONDUCTOR MEMORY DEVICE AND DATA OUTPUT METHOD

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 155 days.

This patent is subject to a terminal disclaimer.

(21) Appl. No.: 12/707,140

(22) Filed: Feb. 17, 2010

(65) Prior Publication Data

US 2010/0142290 A1 Jun. 10, 2010

Related U.S. Application Data

(62) Division of application No. 12/114,034, filed on May 2, 2008, now Pat. No. 7,688,645.

(30) Foreign Application Priority Data

May 25, 2007 (JP) .................. 2007-139104

(51) Int. Cl.
*G11C 7/00* (2006.01)

(52) U.S. Cl. .............. 365/189.05; 365/189.09; 365/229

(58) Field of Classification Search ............. 365/189.05, 365/189.09, 229
See application file for complete search history.

(56) References Cited

U.S. PATENT DOCUMENTS

| 5,703,825 | A | 12/1997 | Akiba et al. |
| 6,501,306 | B1 | 12/2002 | Kim et al. |
| 7,688,645 | B2 * | 3/2010 | Matsui ............ 365/189.05 |
| 2003/0080780 | A1 | 5/2003 | Okamoto et al. |
| 2005/0212557 | A1 | 9/2005 | Nagata |

FOREIGN PATENT DOCUMENTS

JP 2005-304218 10/2005

* cited by examiner

*Primary Examiner* — Hoai V Ho
(74) *Attorney, Agent, or Firm* — Young & Thompson

(57) ABSTRACT

An outputting transistor circuit of a push-pull structure has an outputting PMOS transistor and an outputting NMOS transistor connected in series between a first power supply and a grounded power supply. In a standby state, a voltage level of a gate terminal of the outputting PMOS transistor is set to a voltage level of a second power supply higher than a voltage level of the first power supply. In an active state, a voltage level of the gate terminal of the outputting PMOS transistor is changed to a voltage level of the first power supply in response to an active command or a read command, or in response to the state of a semiconductor memory device changing to the active state or a read state, and either the outputting PMOS transistor or the outputting NMOS transistor is turned ON in response to a data read signal from a memory cell.

25 Claims, 12 Drawing Sheets

OUTPUT CIRCUIT FOR A SEMICONDUCTOR MEMORY DEVICE AND DATA OUTPUT METHOD

This application is a continuation application of application Ser. No. 12/114,034, filed on May 2, 2008, issued as U.S. Pat. No. 7,688,645 on Mar. 30, 2010, the entire contents of which is incorporated by reference.

BACKGROUND OF THE INVENTION

1. Field of the Invention

The present invention relates to a semiconductor memory device such as DRAM (Dynamic Random Access Memory). In particular, the present invention relates to an output circuit for a semiconductor memory device that makes it possible to achieve both a reduction in leakage current when the device is on standby and a reduction in current consumption when the device is active, and to a data output method for using with this output circuit for a semiconductor memory device.

Priority is claimed on Japanese Patent Application No. 2007-139104, filed May 25, 2007, the contents of which are incorporated herein by reference.

2. Description of Related Art

In order to reduce current consumption in a system, in particular, an ASIC (Application Specific Integrated Circuit) chip has been developed in which a reduction in the operating voltage has been achieved. In contrast, in DRAM, due to the need to secure operations of the memory cell portion, it is difficult to achieve a reduction in voltage compared with an ASIC which is a simple logic circuit. When the development periods of DRAM and ASIC are the same, the DRAM typically requires a higher operating voltage than that of the ASIC chip.

FIG. 8 is a block diagram showing a system 1 for a recent mobile device in which DRAM has been mounted, with only that portion which is concerned with the present invention being shown. The system (i.e., a DRAM equipped system) 1 shown in FIG. 8 has an ASIC chip 10, and a DRAM (i.e., a DRAM chip) 20 that is used as a memory section for the ASIC chip 10. The ASIC chip 10 and a DRAM core circuit section 21 inside the DRAM 20 are connected via a data input/output circuit section 30 by means of two-way data lines DQ0 to DQn.

The respective data lines DQ0 to DQn and the ASIC chip 10 are connected by ASIC side drivers (i.e., line drivers) 11 and ASIC side receivers (i.e., line receivers) 12. The respective data lines DQ0 to DQn and the data input/output circuit section 30 inside the DRAM chip 20 are connected by output circuits 31 and input circuits 32.

Using the above described structure, the ASIC chip 10 performs the writing and reading of data on the DRAM 20 through the two-way data lines DQ0 to DQn.

As is shown in FIG. 8, while power supply voltage of 1.2V (VDDA) is supplied to the ASIC chip 10, power supply voltage of 1.8V (VDD) is supplied to the DRAM chip 20. Because of this, the voltage that is used at the interface between the DRAM chip 20 and the ASIC chip 10 needs to be 1.2V for the reasons explained below. Note that this interface is formed by the data input/output circuit section 30.

The first reason is that because the transistors used in the ASIC chip 10 have been optimized to 1.2V operation, it is necessary from the standpoint of gate breakdown voltage for the power supply voltage to be 1.2V or less. The second reason is that by lowering the voltage of the interface between the ASIC chip 10 and the DRAM 20 also to 1.2V, it is possible to curtail the current consumption of the system. Accordingly, in this system, the voltage VDDQ that is supplied to the output circuit 31 of the DRAM is 1.2V, which is a lower voltage than the voltage VDD of 1.8V that is supplied to the DRAM core circuit section 21. Namely, in the DRAM 20, it is only necessary for the output circuit 31 to operate at 1.2V. Here, in order to lower the operating voltage of the circuit, it is necessary for the threshold voltage of the transistors inside the circuit to be lowered. However, if the threshold voltage is lowered, the problem arises that there is an increase in leakage current when the transistors are OFF, and current consumption when the device is on standby increases. A specific example of the output circuit 31 is given below to illustrate this problem.

FIG. 9 is a diagram showing the circuit structure of the conventional DRAM output circuit shown in FIG. 8. In the output circuit shown in FIG. 9, a data reading signal OUTHB from a memory cell (not shown) is converted into a signal OUTH by an inverter that is formed by a PMOS transistor Q101 and an NMOS transistor Q201. The signal OUTH forms a gate signal of a PMOS transistor Q501 for a high signal output. In addition, a data reading signal OUTLB from the memory cell is converted into a signal OUTL by an inverter that is formed by a PMOS transistor Q301 and an NMOS transistor Q401. The signal OUTL forms a gate signal of an NMOS transistor Q601 for a low signal output. A source terminal of the PMOS transistor Q501 is connected to the power supply VDDQ, while a drain terminal thereof is connected to a drain terminal of the NMOS transistor Q601. A source terminal of the NMOS transistor Q601 is connected to VSS. An output signal DQ is output from a connection point between the NMOS transistor Q501 and the NMOS transistor Q601. Note that, in FIG. 9, the PMOS transistors Q101, Q301, and Q501 that are surrounded by dotted lines are low threshold (Low Vt) type PMOS transistors.

In the DRAM output circuit 31 having the above described structure, in order to make it possible for operations to be performed at the low voltage of the power supply VDDQ (i.e., 1.2V), it is necessary to lower the threshold voltage (Vt) of the PMOS transistors Q101, Q301, and Q501 approximately 0.4V from the 1.8V at which the PMOS transistors are used. Typically, because the leakage current when the transistor is OFF increases by one decimal place when the threshold voltage is lowered by 0.1V, the PMOS transistors Q101, Q301, and Q501 become transistors in which there is an increase in the OFF current of approximately four decimal places. In contrast, because the threshold voltage of the NMOS transistors is originally lower by 0.3V to 0.4V than that of the PMOS transistors, and because the OFF current is also reduced, not only are operations possible at the low voltage of 1.2V, but there is also no problem with leakage current. The only problem with leakage current is generated by PMOS transistors which are turned OFF when the device is on standby.

In order to illustrate this leakage current problem, a description is given below of a circuit operation with reference made to the timing chart shown in FIG. 10. Note that in the description given below, for example, the PMOS transistor Q101 is abbreviated to simply Q101.

The signals OUTHB and OUTLB that are input into the output circuit on standby (Standby) are at the levels of VSS and VDD respectively. Accordingly, Q101 is turned ON and the signal OUTH is at the VDDQ level, and Q501 is turned OFF. Moreover, Q301 is OFF and Q401 is ON, and the signal OUTL is at the level of VSS. Q601 is also OFF. Accordingly, the output from the output circuit 31 is in a Hi-z (i.e., high impedance) state.

Next, when an active command (ACT) is input into the DRAM via a command (CMD) input (see FIG. 8) in synchronization with a clock signal CLK, the DRAM core circuit section 21 changes to an active state (Active). In this state, data can be read by means of a read command (RED).

Next, when a read command (RED) is input in synchronization with the clock signal CLK, after two clocks, data is output to the output signal DQ that is connected to the output circuit.

Next, when both the signal OUTHB and the signal OUTLB are at VDD, the signals OUTH and OUTL are both at VSS, the Q501 is ON, the Q601 is OFF, and the output signal DQ at a VDDQ level is output.

Next, when both the signal OUTHB and the signal OUTLB are at VSS, the signals OUTH and OUTL are both at VDDQ, the Q501 is OFF, the Q601 is ON, and the output signal DQ at a VSS level is output.

Next, when a pre-charge command (PRE) is input in synchronization with the clock signal CLK, the DRAM core circuit section 21 once again changes to a standby state (Standby), and the signals OUTHB and OUTLB are respectively at the levels VSS and VDD. Because of this, Q501 and Q601 are both OFF, and the output from the output circuit 31 is in a Hi-z state.

When the device is active, because the operating current is far greater than the leakage current from the transistors, the leakage current does not create a problem. The PMOS transistors which are OFF when on standby are Q301 and Q501, which is a transistor used for output, however, the gate level of Q301 is at the 1.8V VDD level of the DRAM core circuit section 21, and is 0.6V higher than the source level 1.2V of Q301. Because leakage current from the PMOS transistors when they are OFF is suppressed when the gate voltage is higher than the source voltage, the OFF current is at a level at which it does not create any problems.

Leakage current becomes a problem on standby only in the case of Q501 which is used for output, however, because Q501 drives the wiring or the substrate wiring between the DRAM chip and the ASIC chip 10, comparatively large sized transistors are used, and leakage current of several microamperes or more is generated. Typically, because the number of output terminals DQ in a DRAM is from 36 to 72, leakage current in a range of several 100 microamperes to 1 milliamperes is generated in the DRAM overall.

As is shown in FIG. 8, leakage current flows from the output circuit 31 to the ASIC side driver circuit 11 and the ASIC side receiver 12, and is the current consumed by the system when the DRAM is on standby. Typically, because DRAM having lower current consumption when on standby is in demand for DRAM used in mobile applications, it is not possible to overlook leakage current from transistors on standby in an output circuit.

Here, by setting the gate level of a PMOS transistor higher than the source level, it is possible to set the level of OFF at a deeper level and thereby restrict leakage current from the PMOS transistor. FIG. 11 shows a circuit in which the power supply of the inverter section that drives the gates of the transistors that are used for output is altered from VDDQ to VDD. FIG. 12 shows a timing chart of an output circuit of the DRAM shown in FIG. 11.

In the circuit shown in FIG. 11, the voltage of the drain of Q101 in the circuit shown in FIG. 9 has been altered to VDD (1.8V), but the basic circuit structure and operations are the same as the circuit shown in FIG. 9. In the timing chart shown in FIG. 12 as well, the only point of variance from the timing chart shown in FIG. 10 is that the output voltage VDDQ (1.2V) of the signal OUTH has changed to VDD (1.8V), and the basic timing is the same. Accordingly, any redundant explanation is omitted.

When the circuit is altered to the output circuit shown in FIG. 11, because the gate level of Q501 on standby is VDD=1.8V, leakage current is suppressed, and the above described problem of an increase in the system current on standby is solved. However, as is described above, because the size of the outputting PMOS transistors is large, current charging and discharging at the gate takes place at the level of the power supply VDD (VDD=1.8V), and the fact that operating current in the DRAM overall ends up increasing approximately several tens of milliamperes creates a problem.

Note that the power supply driver device disclosed in Japanese Unexamined Patent Application, First Publication No. 2005-304218 (referred to below as Patent document 1) exists as an output circuit that is constructed so as to be suitable for low voltage operations. However, this power supply driver device is not one in which, without there being any increase in operating current, leakage current is suppressed when the device is on standby.

As has been described above, in a conventional output circuit for a semiconductor memory device, leakage current during standby is suppressed by setting the gate level of the PMOS transistors for output to the voltage level of the power supply VDD which is a higher voltage level than that of the power supply VDDQ which is supplied to the output circuit, however, on the other hand, the problem arises that there is an increase in current when the device is active.

SUMMARY OF THE INVENTION

The present invention was conceived in view of the above described circumstances, and it is an object thereof to provide an output circuit for a semiconductor memory device that makes it possible to achieve both a reduction in leakage current when the device is on standby and a lowering of current consumption when the device is active, and also a data output method for an output circuit for a semiconductor memory device.

An output circuit for a semiconductor memory device of the present invention comprises: an outputting transistor circuit of a push-pull structure having an outputting PMOS transistor whose source terminal is connected to a first power supply, and an outputting NMOS transistor whose source terminal is connected to a grounded power supply and whose drain terminal is connected in series to a drain terminal of the outputting PMOS transistor; and a gate level setting section that sets a voltage level of a gate terminal of the outputting PMOS transistor, and sets a voltage level of a gate terminal of the outputting NMOS transistor, wherein the gate level setting section is provided with: a standby state gate level setting section that, in a standby state in which both the outputting PMOS transistor and the outputting NMOS transistor are OFF, sets the voltage level of the gate terminal of the outputting PMOS transistor to a voltage level of a second power supply that is higher than a voltage level of the first power supply; and an active state gate level setting section that, in an active state in which either one of the outputting PMOS transistor and the outputting NMOS transistor is turned ON in response to a data read signal from a memory cell and a signal is output from a connection point between the outputting PMOS transistor and the outputting NMOS transistor, causes the voltage level of the gate terminal of the outputting PMOS transistor to change to the voltage level of the first power supply in response to an active command or a read command issued to the semiconductor memory device, or in response to the state of the semiconductor memory device changing to the active state or a read state.

In the output circuit for a semiconductor memory device of the present invention which has the above described structure, when on standby, the voltage level of the gate terminal of a PMOS transistor which is used for outputting is set to the voltage level of a second power supply which is higher than the voltage level of a first power supply, while when active, in response to an active command or a read command, or in response to the state of the semiconductor memory device changing to an operating state or a read state, the voltage level of the gate terminal of the outputting PMOS transistor is changed from the voltage level of the second power supply to the voltage level of the first power supply, and the output circuit is operated at the voltage level of the first power supply.

As a result, it is possible to achieve both a reduction in leakage current in a standby state and a lowering of current consumption in an active state.

Preferably, in the output circuit, the gate level setting section is provided with: a first inverter in which a drain terminal of a first PMOS transistor and a drain terminal of a first NMOS transistor are connected in series, and in which first read data from the memory cell is input in common to respective gate terminals of both the first PMOS transistor and the first NMOS transistor, and that inverts the logic of the first read data, and outputs the inverted first read data to the gate terminal of the outputting PMOS transistor; a second inverter that uses the first power supply as an input power supply, and in which a drain terminal of a second PMOS transistor and a drain terminal of a second NMOS transistor are connected in series, and in which second read data from the memory cell is input in common to respective gate terminals of both the second PMOS transistor and the second NMOS transistor, and that inverts the logic of the second read data, and outputs the inverted second read data to the gate terminal of the outputting NMOS transistor; a first gate level setting NMOS transistor whose drain terminal is connected to the first power supply, and whose source terminal is connected to a source terminal of the first PMOS transistor that forms the first inverter; and a first gate level setting PMOS transistor whose source terminal is connected to the second power supply, and whose drain terminal is connected to the source terminal of the first PMOS transistor that forms the first inverter, and wherein in the active state, in response to the active command or the read command issued to the semiconductor memory device, or in response to the state of the semiconductor memory device changing to the active state or the read state, a first gate level setting signal is generated to change the first gate level setting NMOS transistor to ON, and in the standby state, a second gate level setting signal is generated to change the first gate level setting PMOS transistor to ON.

In the output circuit for a semiconductor memory device of the present invention which has the above described structure, in order to supply a power supply voltage to a first inverter formed by connecting a first PMOS transistor and a first NMOS transistor in series, inverts the logic of first read data from a memory cell, and outputs it to the gate terminal of an outputting PMOS transistor, there are provided an NMOS transistor for setting a first gate level and a PMOS transistor for setting a second gate level. In addition, when on standby, the second gate level setting PMOS transistor is set to ON, and the power supply of the first inverter is used for the second power supply, and the voltage level of the gate terminal of the outputting PMOS transistor is set to the voltage level of the second power supply. Moreover, when active, the first gate level setting NMOS transistor is set to ON, the power supply of the first inverter is used for the first power supply, and the voltage level of the gate terminal of the outputting PMOS transistor is set to the voltage level of the first power supply.

As a result, it is possible to achieve both a reduction in leakage current in a standby state and a lowering of current consumption in an active state.

Preferably, the output circuit further comprises a booster section that generates a third power supply by boosting the voltage level of the second power supply, wherein, in the operating state, the first gate level setting signal is a signal at the voltage level of the third power supply.

In the output circuit for a semiconductor memory device of the present invention which has the above described structure, the voltage level of a first gate level setting signal which turns ON the first gate level setting NMOS transistor is set to the voltage level of a third power supply which is higher than the voltage level of the second power supply.

As a result, when the first gate level setting NMOS transistor is set to ON, and the voltage level of the source terminal of the first gate level setting NMOS transistor is at the VDDQ level, it is possible to reliably maintain the first gate level setting NMOS transistor in an ON state.

Preferably, in the output circuit, the voltage level of the third power supply is not less than a voltage level obtained by adding a threshold voltage of the first gate level setting NMOS transistor to the voltage level of the second power supply.

In the output circuit for a semiconductor memory device of the present invention which has the above described structure, the voltage level of the third power supply is set to not less than the voltage level of the second power supply plus the threshold voltage of the first gate level setting NMOS transistor.

As a result, by utilizing the first power supply VDDQ of the output circuit of the semiconductor memory device, the second power supply which is the power supply of the internal circuit of the semiconductor memory device, and the third power supply which is generated from the second power supply, it is possible to achieve both a reduction in leakage current in a standby state and a lowering of current consumption in an active state.

Preferably, the output circuit further comprises a resistor that is inserted between the drain terminal of the first gate level setting PMOS transistor and the source terminal of the first PMOS transistor which forms the first inverter.

As a result, when the power is turned on, even when the signals that are input into the respective gate terminals of the first gate level setting NMOS transistor and the second gate level setting PMOS transistor are at an indeterminate level that has not been established logically, it is possible to suppress any large current flow as a result of the first power supply and the second power supply which have different potentials short-circuiting.

Preferably, in the output circuit, the gate level setting section is provided with: a third inverter that uses the first power supply as an input power supply, and in which a drain terminal of a third PMOS transistor and a drain terminal of a second gate level setting NMOS transistor are connected in series, and in which a drain terminal of a third NMOS transistor is connected in series to a source terminal of the second gate level setting NMOS transistor, and in which first read data from the memory cell is input in common to respective gate terminals of both the third PMOS transistor and the third NMOS transistor, and that inverts the logic of the first read data, and outputs the inverted first read data to the gate terminal of the outputting PMOS transistor from the source terminal of the second gate level setting NMOS transistor; a fourth inverter that uses the first power supply as an input power supply, and in which a drain terminal of a fourth PMOS transistor and a drain terminal of a fourth NMOS transistor are connected in series, and in which second read data from the memory cell is input in common to respective gate terminals of both the fourth PMOS transistor and the fourth NMOS transistor, and that inverts the logic of the second read data, and outputs the inverted second read data to the gate terminal of the outputting NMOS transistor; and a second gate level setting PMOS transistor whose source terminal is connected to the second power supply, and whose drain terminal is connected to the gate terminal of the outputting PMOS transistor, and wherein in the active state, in response to the active command or the read command issued to the semiconductor memory device, or in response to the state of the semiconductor memory device changing to the active state or the read state, a first gate level setting signal is generated to change the second gate level setting NMOS transistor to ON, and in the standby state, a second gate level setting signal is generated to change the second gate level setting PMOS transistor to ON.

In the output circuit for a semiconductor memory device of the present invention which has the above described structure, the first power supply is used for the input power supply, and the third PMOS transistor, the second gate level setting NMOS transistor, and the third NMOS transistor are connected in series. In addition, a third inverter is provided that logically inverts the first read data from the memory cell, and outputs the inverted first read data to the gate terminal of the outputting PMOS transistor from the source terminal of the second gate level setting NMOS transistor. Moreover, a second gate level setting PMOS transistor is provided whose source terminal is connected to the second power supply, and whose drain terminal is connected to the gate terminal of the outputting PMOS transistor. Furthermore, when on standby, the second gate level setting PMOS transistor is turned to ON, and the voltage level of the gate terminal of the outputting PMOS transistor is set to the voltage level of the second power supply (the voltage level of the second power supply>the voltage level of the first power supply). Moreover, when active, the second gate level setting NMOS transistor is turned to ON, and the voltage level of the gate terminal of the outputting PMOS transistor is set to the voltage level of the first power supply.

As a result, it is possible to avoid delays being generated in the startup timing of the first read data, and it is possible to generate a through-current between the outputting PMOS transistor and the outputting NMOS transistor.

Preferably, the output circuit further comprises a booster section that generates a third power supply by boosting the voltage level of the second power supply, wherein, in the operating state, the first gate level setting signal is a signal at the voltage level of the third power supply.

In the output circuit for a semiconductor memory device of the present invention which has the above described structure, the voltage level of a first gate level setting signal which turns ON the second gate level setting NMOS transistor is set to the voltage level of a third power supply which is higher than the voltage level of the second power supply.

As a result, when the second gate level setting NMOS transistor is ON, and the voltage level of the source terminal of the second gate level setting NMOS transistor is at the voltage level of the first power supply, it is possible to reliably maintain the second gate level setting NMOS transistor in an ON state.

Preferably, in the output circuit, the voltage level of the third power supply is not less than a voltage level obtained by adding a threshold voltage of the second gate level setting NMOS transistor to the voltage level of the second power supply.

In the output circuit for a semiconductor memory device of the present invention which has the above described structure, the voltage level of the third power supply is set to not less than the voltage level of the second power supply plus the threshold voltage of the second gate level setting NMOS transistor.

As a result, by utilizing the first power supply of the output circuit of the semiconductor memory device, the second power supply of the internal circuit of the semiconductor memory device, and the third power supply which is generated from the second power supply, it is possible to achieve both a reduction in leakage current in an standby state and a lowering of current consumption in an active state.

Preferably, the output circuit further comprises a resistor that is inserted between the drain terminal of the second gate level setting PMOS transistor and the gate terminal of the outputting PMOS transistor.

As a result, when the power is turned on, even when the signals that are input into the respective gate terminals of the second gate level setting NMOS transistor and the second gate level setting PMOS transistor are at an indeterminate level that has not been established logically, it is possible to suppress any large current flow as a result of the first power supply and the second power supply which have different potentials short-circuiting.

Preferably, in the output circuit, the gate level setting section is provided with: a third inverter that uses the first power supply as an input power supply, and in which a drain terminal of a third PMOS transistor and a drain terminal of a second gate level setting NMOS transistor are connected in series, and in which a drain terminal of a third NMOS transistor is connected in series to a source terminal of the second gate level setting NMOS transistor, and in which first read data from the memory cell is input in common to respective gate terminals of both the third PMOS transistor and the third NMOS transistor, and that inverts the logic of the first read data, and outputs the inverted first read data to the gate terminal of the outputting PMOS transistor from the source terminal of the second gate level setting NMOS transistor; a booster section that generates a third power supply by boosting the voltage level of the second power supply; a fifth inverter that uses the first power supply as an input power supply, and in which a drain terminal of a fifth PMOS transistor and a drain terminal of a third gate level setting NMOS transistor are connected in series, and in which a drain terminal of a fifth NMOS transistor is connected in series to a source terminal of the third gate level setting NMOS transistor, and in which a gate terminal of the third gate level setting NMOS transistor is connected to the third power supply, and in which second read data from the memory cell is input in common to respective gate terminals of both the fifth PMOS transistor and the fifth NMOS transistor, and that inverts the logic of the second read data, and outputs the inverted second read data to the gate terminal of the outputting NMOS transistor from the source terminal of the third gate level setting NMOS transistor; a fourth gate level setting NMOS transistor whose drain terminal is connected to the first power supply, and whose source terminal is connected to the gate terminal of the outputting PMOS transistor; a fifth gate level setting NMOS transistor whose drain terminal is connected to the gate terminal of the outputting NMOS transistor, and whose source terminal is connected to a grounded power supply; and a sixth inverter that uses the first power supply as an input power supply, and in which a drain terminal of a sixth PMOS transistor and a drain terminal of a sixth NMOS transistor are connected in series, and in which the second power supply is input in common to respective gate terminals of both the sixth PMOS transistor and the sixth NMOS transistor, and that generates a signal that is input in common to respective gate terminals of the fourth gate level setting NMOS transistor and the fifth gate level setting NMOS transistor.

In the output circuit for a semiconductor memory device of the present invention which has the above described structure, when the power is turned on, if a state is generated in which only the first power supply is given precedence to start up, and the second power supply is not started up, it is possible to avoid the problem of a large current being generated as a result of the fact that both the outputting PMOS transistor and the outputting NMOS transistor are set to ON.

That is, in order to solve this problem, the fourth gate level setting NMOS transistor is connected to the gate terminal of the outputting PMOS transistor so as to charge the voltage of the gate terminal of the outputting PMOS transistor from the first power supply, when a state is generated in which only the first power supply is given precedence to start up and the second power supply is not started up. Moreover, in order to limit the voltage level of the gate terminal of the outputting NMOS transistor to the ground potential, the drain terminal of the fifth gate level setting NMOS transistor is connected to the gate terminal of the outputting NMOS transistor. A sixth inverter is also provided which is formed by the sixth PMOS transistor and the sixth NMOS transistor and which uses the second power supply for its input signal, and an output signal from the sixth inverter is input into the gate terminals of the fourth gate level setting NMOS transistor and the fifth gate level setting NMOS transistor.

Furthermore, a fifth inverter is provided in which the third gate level setting NMOS transistor is inserted between the fifth PMOS transistor and the fifth NMOS transistor, and the gate terminal of the fifth gate level setting NMOS transistor is connected to the third power supply. In addition, the gate terminal of the outputting NMOS transistor is driven by the source terminal of the fifth gate level setting NMOS transistor. Because the third power supply is generated from the second power supply, when the second power supply is not started up when the power is turned on, the gate of the third gate level setting NMOS transistor is the ground potential, and the third gate level setting NMOS transistor is set to OFF. As a result, it is possible to prevent the signal line of the gate of the outputting NMOS transistor being charged to the voltage level of the first power supply.

As a result, even in a state in which only the first power supply is started up when power is turned on, it is possible to prevent both the outputting PMOS transistor and the outputting NMOS transistor being turned ON, and a large current being generated.

A data output method of the present invention comprises: in a standby state, turning both an outputting PMOS transistor whose source terminal is connected to a first power supply and an outputting NMOS transistor whose source terminal is connected to a grounded power supply and whose drain terminal is connected in series to a drain terminal of the outputting PMOS transistor OFF, the outputting PMOS transistor and the outputting NMOS transistor being provided in an outputting transistor circuit of a push-pull structure; in the standby state, setting a voltage level of a gate terminal of the outputting PMOS transistor to a voltage level of a second power supply that is higher than a voltage level of the first power supply; in an active state, changing a voltage level of the gate terminal of the outputting PMOS transistor to a voltage level of the first power supply in response to an active command or a read command issued to the semiconductor memory device, or in response to the state of the semiconductor memory device changing to an active state or a read state; and in the active state, turning either one of the outputting PMOS transistor and the outputting NMOS transistor ON in response to a data read signal from a memory cell, and outputting a signal from a connection point between the outputting PMOS transistor and the outputting NMOS transistor.

In the data output method for an output circuit for the semiconductor memory device of the present invention which includes the above described steps, when on standby, the voltage level of the gate terminal of an outputting PMOS transistor is set to the voltage level of a second power supply which is higher than the voltage level of a first power supply. Moreover, when active, in response to an active command or a read command, or in response to the state of the semiconductor memory device changing to an active state (Active) or a read state, the voltage level of the gate terminal of the outputting PMOS transistor is changed from the voltage level of the second power supply to the voltage level of the first power supply, and the output circuit is operated at the voltage level of the first power supply.

As a result, it is possible to achieve both a reduction in leakage current in a standby state and a lowering of current consumption in an active state.

As has been described above, in the present invention, when on standby, by making the voltage level of the gate terminal of an outputting PMOS transistor higher than the voltage level of a first power supply that is supplied to an output circuit, it is possible to suppress leakage current during standby. Moreover, when active, as a result of the voltage level of the gate terminal of the outputting PMOS transistor changing to the voltage level of the first power supply, and the output circuit being operated at the voltage level of the first power supply in response to an active command or a read command, or in response to the state of the semiconductor memory device changing to an active state or a read state, it is possible to achieve a reduction in current consumption in an active state.

DETAILED DESCRIPTION OF THE INVENTION

Respective embodiments of the present invention are described below with reference made to the attached drawings.

First Embodiment

Description of the Structure of the First Embodiment

Figure 1:
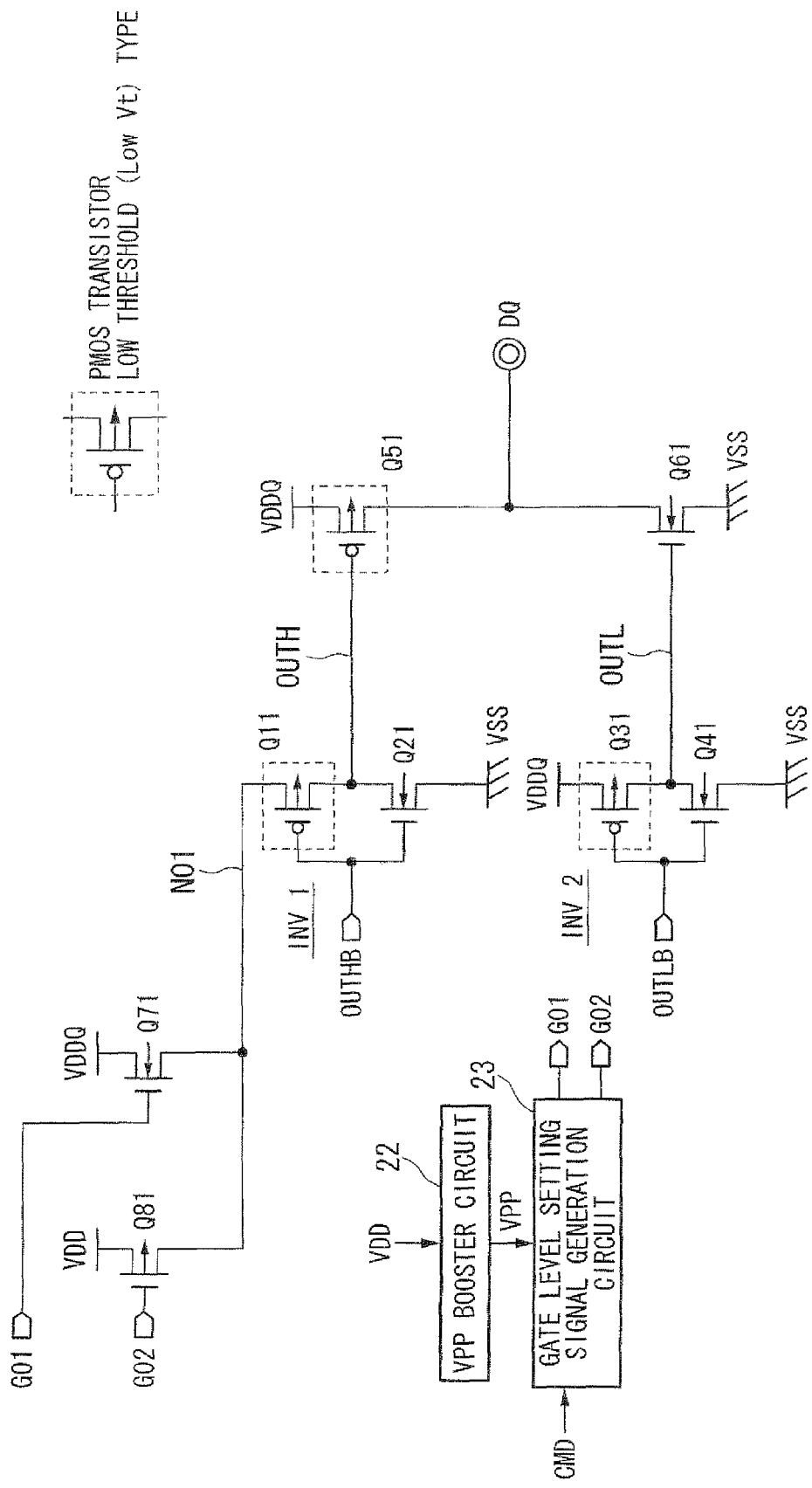
FIG. 1 is a diagram showing the structure of an output circuit of a semiconductor memory device according to a first embodiment of the present invention.

FIG. 1 is a diagram showing the structure of an output circuit of a semiconductor memory device according to the first embodiment of the present invention.

The output circuit shown in FIG. 1 is driven by a power supply VDD (1.2V) for an output circuit and by a power supply VDD (1.8V) for an internal circuit inside a DRAM.

As is shown in FIG. 1, a data read signal OUTHB from a memory cell (not shown) is converted into a signal OUTH by an inverter INV1 that is formed by a PMOS transistor Q11 and an NMOS transistor Q21. The signal OUTH forms a gate signal of an outputting PMOS transistor Q51 that outputs a high signal.

A data read signal OUTLB from a memory cell is converted into a signal OUTL by an inverter INV2 that is formed by a PMOS transistor Q31 and an NMOS transistor Q41. The signal OUTL forms a gate signal of an outputting NMOS transistor Q61 that outputs a low signal.

A source terminal of the outputting PMOS transistor Q51 is connected to a power supply VDDQ for an outputting circuit, while a drain terminal thereof is connected to a drain terminal of the outputting NMOS transistor Q61. A source terminal of the outputting NMOS transistor Q61 is connected to VSS. An output signal DQ is output from a connection point between the outputting PMOS transistor Q51 and the outputting NMOS transistor Q61. Note that the PMOS transistors Q11, Q31, and Q51 that are surrounded by dotted lines are low threshold (Low Vt) type PMOS transistors.

In addition, there is provided an NMOS transistor Q71 whose source terminal is connected to a source connection point N01 of the PMOS transistor Q11 which makes up the inverter INV1, and whose drain terminal is connected to VDDQ. There is also provided a PMOS transistor Q81 whose drain terminal is connected to the source connection point N01 of the PMOS transistor Q11, and whose source terminal is connected to the internal circuit power supply VDD which is supplied to the DRAM core circuit section.

Note that a gate signal G01 of the NMOS transistor Q71 and a gate signal G02 of the PMOS transistor Q81 are gate level setting signals that are generated by a gate level setting signal generation circuit 23. Moreover, a VPP booster circuit 22 is a circuit that generates a power supply VPP which is obtained by boosting the voltage of the power supply VDD. In the gate level setting signal generation circuit 23, a gate level setting signal G01 for an active state and a gate level setting signal G02 for a standby state are generated and output in response to commands (CMD) such as an active command (ACT) which is described below. In this case, the gate level setting signal G01 is output as a signal for the voltage level of the power supply VPP (i.e., for the VPP level), and the gate level setting signal G02 is output as a signal for the voltage level of the power supply VDD (i.e., for the VDD level) (these are described below in detail).

Using the NMOS transistor Q71 and the PMOS transistor Q81 a structure is formed which makes it possible to set the gate level of the outputting PMOS transistor Q51 to the optimum level both when on standby and when active by changing the voltage level of the source connection point N01 when on standby and when active respectively to the VDD level and the VDDQ level.

Note that for the reason described below, an NMOS transistor is used instead of a PMOS transistor for the transistor Q71.

If a PMOS transistor is used for the transistor that Q71, then the potential at the source and the N well is VDDQ. Because the level of the source connection point N01 when on standby is VDD which is a higher level than VDDQ, if a PMOS transistor is used, a forward current is generated between the drain terminal which is at the VDD level and the N well which is at the VDDQ level. Moreover, if the voltage of the N well is VDD, then although the above described problem is solved, if the VDDQ starts up earlier than the VDD when the power is turned on, there is still a danger that a forward current will be generated between the source terminal and the N well. Accordingly, by making the transistor Q71 an NMOS transistor, then the problem of a forward current being generated is necessarily avoided. If the transistor Q71 is an NMOS transistor, then it is necessary to make the gate level when the transistor is ON equal to or greater than "VDD+Vt (NMOS transistor threshold)", by using the VPP booster circuit 22 inside the DRAM, it is possible to use the voltage level of the power supply VPP (VPP=2.7V) whose voltage level has been boosted from the power supply VDD.

Note that the voltage level of the power supply VPP (2.7V) is not limited to 2.7V and may be another voltage provided that it is equal to or greater than a voltage which is obtained by adding the threshold voltage Vt of the NMOS transistor Q71 to the voltage level of the power supply VDD (which is 1.8V in the present example) (i.e., VPP≧VDD+Vt).

Note also that the above described the first power supply corresponds to the power supply VDDQ, the second power supply corresponds to the power supply VDD, and the third power supply corresponds to the power supply VPP. Moreover, the above described outputting PMOS transistor corresponds to Q51, the outputting NMOS transistor corresponds to Q61, the first inverter corresponds to the PMOS transistor Q11 and the NMOS transistor Q21, and the second inverter corresponds to the PMOS transistor Q31 and the NMOS transistor Q41. The first gate level setting NMOS transistor corresponds to the NMOS transistor Q71, and the first gate level setting PMOS transistor corresponds to the PMOS transistor Q81. The first gate level setting signal corresponds to the signal G01, and the second gate level setting signal corresponds to the signal G02. The aforementioned standby gate level setting section corresponds principally to the inverter INV1 (Q11 and Q21), the PMOS transistor Q81, and the gate level setting signal generation circuit 23, while the aforementioned active gate level setting section corresponds principally to the inverter INV1 (Q11 and Q21), the NMOS transistor Q71, and the gate level setting signal generation circuit 23.

Description of an Operation of the First Embodiment

Figure 2:
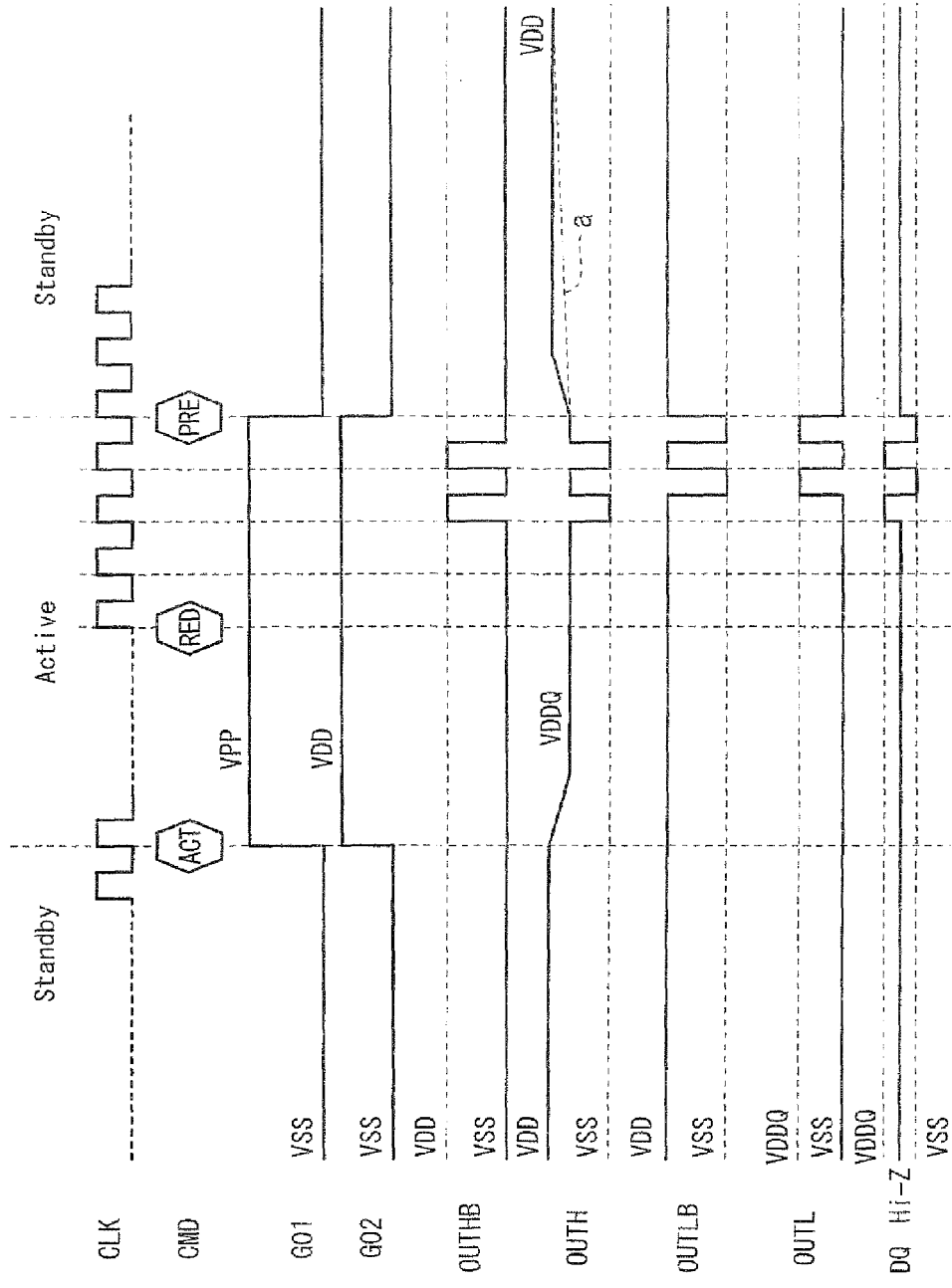
FIG. 2 is a timing chart illustrating an operation of the circuit shown in FIG. 1.

FIG. 2 is a timing chart illustrating an operation of the circuit shown in FIG. 1. An operation of the circuit shown in FIG. 1 will now be described with reference made to the timing chart shown in FIG. 2. Note that, in the description given below, for example the NMOS transistor Q71 is abbreviated to simply Q71.

When on standby, the signal OUTHB and the signal OUTLB that are input into the output circuit are respectively VSS and VDD. The gate level setting signals G01 and G02 are both VSS, Q71 is OFF, Q81 is ON, and the source connection point N01 is at the VDD level. Q11 is ON, and the level of the signal OUTH is VDD=1.8V. Q51 is OFF, however, because the source voltage thereof is VDDQ=1.2V and the gate voltage thereof is 1.8V, leakage current is restricted to a level where it can be disregarded. Accordingly, power consumption in a standby state does not become a problem. Moreover, Q31 is OFF, Q41 is ON, the signal OUTL is at the level of VSS, and Q61 is also OFF. Accordingly, output from this output circuit is in a Hi-z (i.e., high impedance) state.

Next, when an active command (ACT) is input into DRAM as a command input (CMD) in synchronization with a clock signal CLK, the DRAM core circuit section enters into an active state (Active), and in this state data reading by means of a read command (RED) becomes possible. At this time, in response to the active command (ACT), the level of the gate level setting signal G01 changes from VDD to a boosted voltage level (VPP=2.7V) as a result of voltage boosting by the VPP booster circuit 22. In addition, in response to the active command (ACT), the level of the gate level setting signal G02 also changes to the VDD level. As a result, Q81 is OFF, Q71 is ON, and the level of the source connection point N01 is at the level of VDDQ.

Next, when a read command (RED) is input in synchronization with the clock signal CLK, after two clocks, data is output to the output terminal DQ that is connected to the output circuit. When both the signal OUTHB and the signal OUTLB are at VDD, the signals OUTH and OUTL are both at VSS, Q51 is ON, Q61 is OFF, and a VDDQ level is output to the output terminal DQ.

When both the signal OUTHB and the signal OUTLB are at VSS, the signals OUTH and OUTL are both at VDDQ, Q51 is OFF, Q61 is ON, and a VSS level is output to the output terminal DQ. Here, when the output circuit is active, the gate terminal of the outputting PMOS transistor Q51 is charged to the level of VDDQ=1.2V by the signal OUTH and is then discharged, so that low current consumption in an active state becomes possible.

Next, when a pre-charge command (PRE) is input in synchronization with the clock signal CLK, the DRAM core circuit section once again changes to a standby state (Standby), and the signals OUTHB and OUTLB are respectively at the levels VSS and VDD. At this time, in response to the pre-charge command (PRE), the level of the gate level setting signal G01 changes from VPP to VSS, and the level of the gate level setting signal G02 changes from VDD to VSS. Accordingly, Q71 is OFF, Q81 is ON, and the source connection point N01 is at the level of VDD. Q11 is ON, and the level of the signal OUTH is VDD=1.8V. Q51 and Q61 are both OFF, and the output from the output circuit returns to a Hi-z state.

Figure 3:
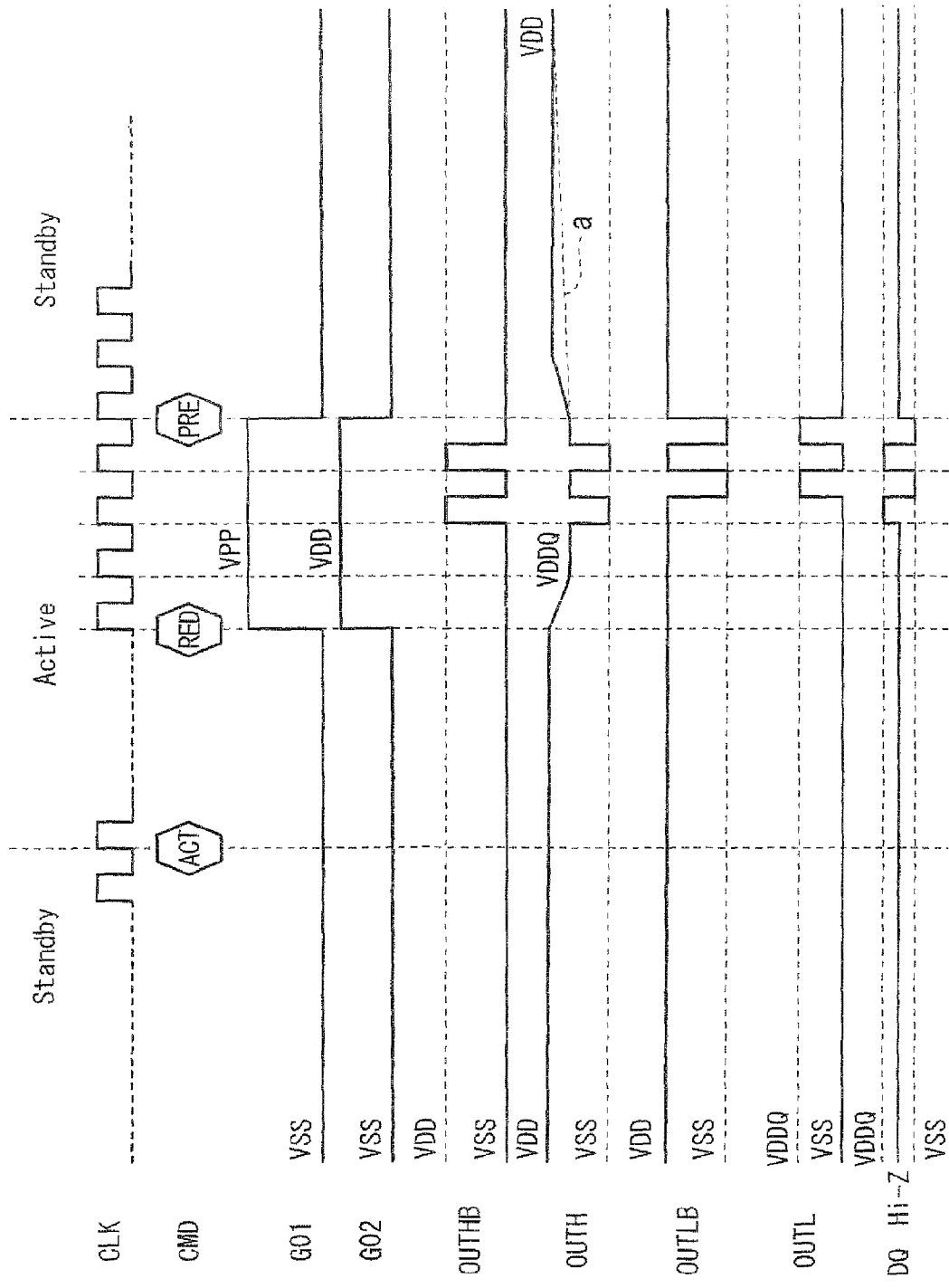
FIG. 3 is a timing chart illustrating another operation of the circuit shown in FIG. 1.

FIG. 3 is a timing chart showing a case in which the transition timings of the gate level setting signals G01 and G02 that are used to perform an output operation are taken not from an active command (ACT), but from a read command (RED). In the example shown in FIG. 3, it is possible to suppress leakage current when the DRAM is in an active state (Active), and a state of waiting for an input of a read command (RED) is continuing.

Second Embodiment

Figure 4:
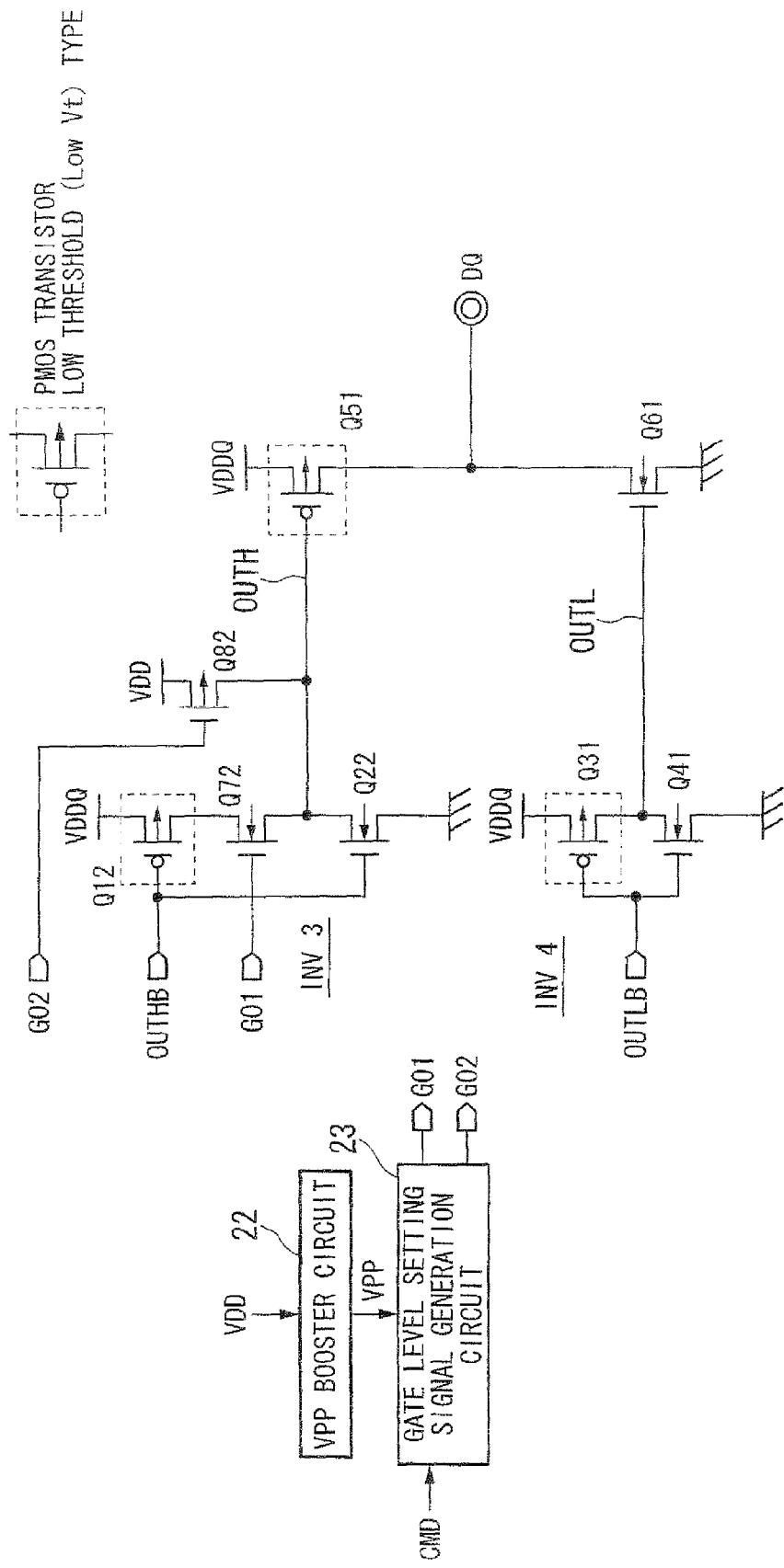
FIG. 4 is a diagram showing the structure of an output circuit of a semiconductor memory device according to a second embodiment of the present invention.

In the example shown in FIG. 4, an inverter INV3 into which read data OUTHB from a memory cell is input is formed by a PMOS transistor Q12, an NMOS transistor Q71, and an NMOS transistor Q22. The NMOS transistor Q72 into which the gate level setting signals G01 are input is connected to the drain side of the PMOS transistor Q12 whose source is connected to the power supply VDDQ, and the drain terminal of the PMOS transistor Q82 into which the gate level setting signal G02 is input is connected directly to the gate terminal of the outputting PMOS transistor Q51. Note that the connection between the outputting PMOS transistor Q51 and the outputting NMOS transistor Q61 is the same as in the example shown in FIG. 1, while the structure of the inverter 4 is the same as the structure of the inverter INV2 shown in FIG. 1.

Note that the above described third inverter corresponds to the inverter INV3 that is formed by the PMOS transistor Q12, the NMOS transistor Q72, and the NMOS transistor Q22. In addition, the above described fourth inverter corresponds to the inverter INV4 that is formed by the PMOS transistor Q31 and the NMOS transistor Q41.

Next, a description will be given of the standby and active states.

In the standby state, because both the gate level setting signals G01 and G02 are VSS, Q72 is OFF, and Q82 is ON, the level of the signal OUTH is the voltage level of the power supply VD (1.8V). Accordingly, in the same way as in the example shown in FIG. 1, Q51 is OFF, however, the source voltage of Q51 is at the voltage level of the power supply VDDQ (1.2V), and the gate voltage of Q51 is 1.8V. Accordingly, leakage current is suppressed, and current consumption in a standby state does not become a problem.

Next, when the DRAM core circuit section is in an active state (Active), the level of the gate level setting signal G01 changes to VPP=2.7V, and the gate level setting signal G02 changes to the level of VDD. As a result, Q82 is OFF, Q72 is ON, and the level of the signal OUTH changes to the VDDQ level. Here, because the source of the PMOS transistor Q12 is directly connected to the power supply VDDQ, there is no lowering of the source level even during an output operation. Because of this, it is possible to avoid a through-current being generated by the PMOS transistor Q51 and the NMOS transistor Q61. Moreover, even if the source level of the PMOS transistor Q51 is at the low voltage of 1.2V, because there is no lowering of the source level, it is possible to suppress any deterioration in the operation waveform of the signal.

Third Embodiment

Figure 5:
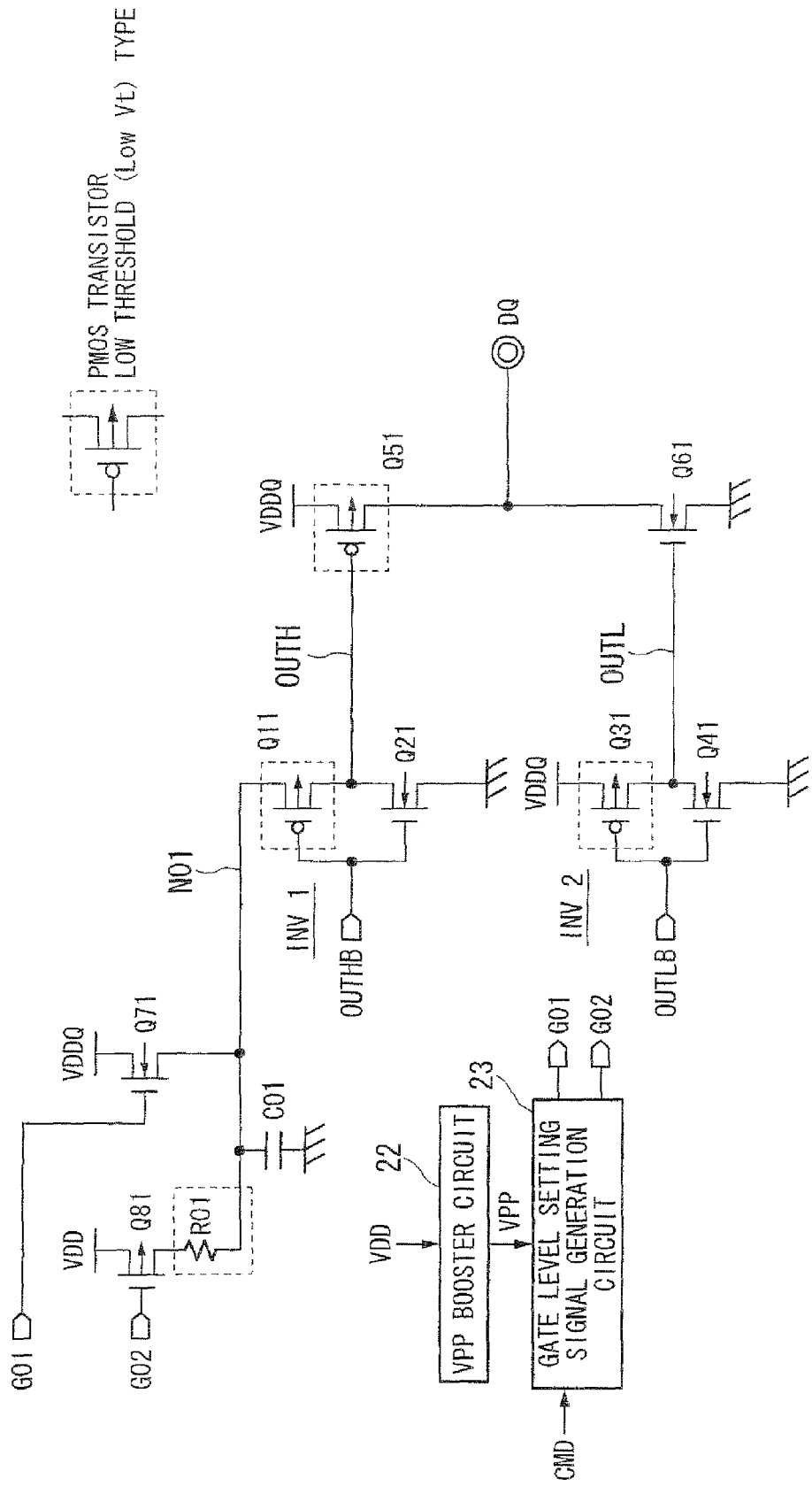
FIG. 5 is a diagram showing the structure of an output circuit of a semiconductor memory device according to a third embodiment of the present invention.

In the output circuit of the third embodiment shown in FIG. 5, in the output circuit of the first embodiment shown in FIG. 1, a resistor R01 of between 100K to 1M ohms is inserted at the drain terminal of the PMOS transistor Q81 to which the power supply VDD is supplied. When a state is generated in which both the transistors Q81 and Q71 are ON, there is a possibility of the power supplies VDD and VDDQ, which have different potentials, short-circuiting which would result in a large current flow, however, by employing the structure shown in FIG. 5, it is possible to restrict short-circuit current.

Moreover, if so desired, it is also possible to add a capacitor C01 to form a CR integrating circuit. In this case, the change of the signal OUTH to VDD (1.8V) may on occasion be delayed by approximately 1 microseconds, however, this does not cause a problem as the aim is to suppress leakage current when on standby.

Figure 6:
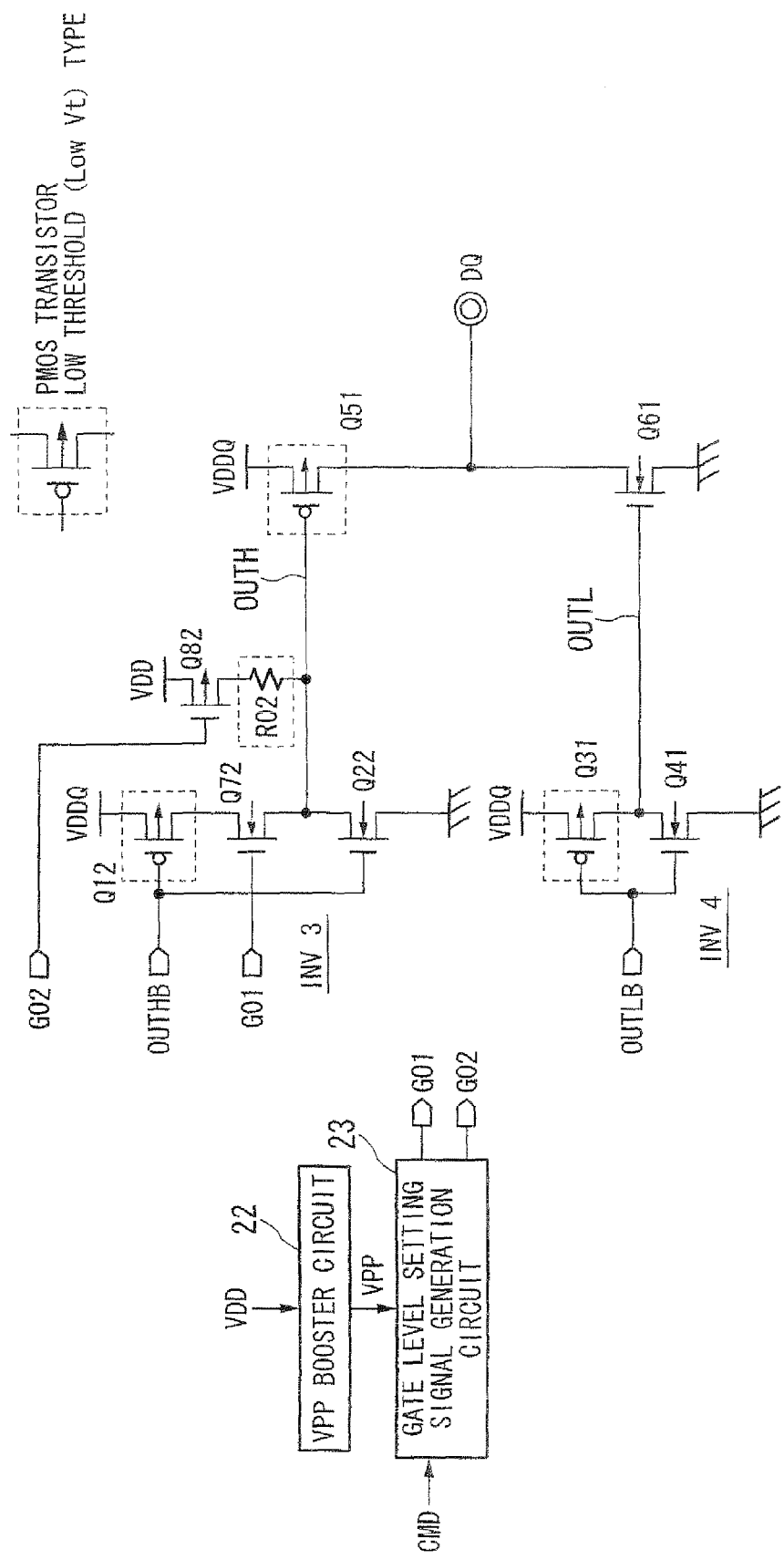
FIG. 6 is a diagram showing the structure of an output circuit of a semiconductor memory device according to a fourth embodiment of the present invention.

Note that the waveform of the signal OUTH in the output circuit shown in FIG. 5 is shown by the dash line "a" in the timing charts in FIGS. 2 and 3. Moreover, as in the example shown in FIG. 5, by inserting the resistor R01, an additional effect is obtained in that peak current can be suppressed when the signal OUTH is being charged from VDDQ to VDD during the transition to a standby state Fourth Embodiment The output circuit of the fourth embodiment shown in FIG. 6 shows an example in which, in the output circuit of the second embodiment shown in FIG. 4, in the same way as in the third embodiment, a resistor R02 of between 100K to 1M ohms is inserted at the drain terminal of the PMOS transistor Q82 to which VDD is supplied. The remaining structural elements are the same as in the example shown in FIG. 4.

By employing the structure shown in FIG. 6, the same effects as those in the third embodiment are obtained. Namely, when the power supply is turned on, even when the signal that is input into the gate terminal of the gate level setting NMOS transistor Q72 and the signal that is input into the gate terminal of the gate level setting PMOS transistor Q82 are at an indeterminate level that has not been established logically, it is possible to suppress any large current flow that is caused by the power supplies VDD and VDDQ, which have different potentials, short-circuiting.

Fifth Embodiment

Figure 7:
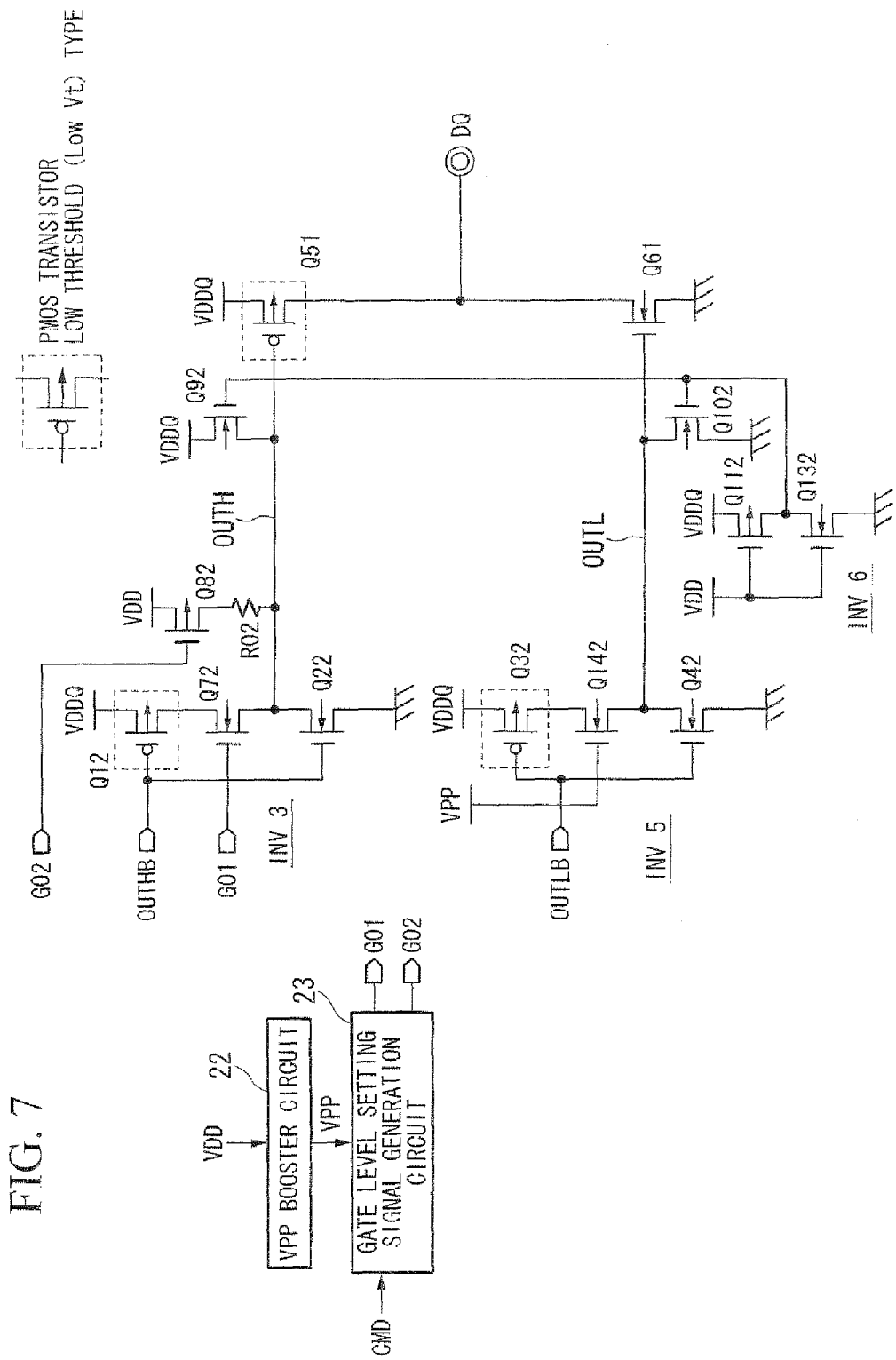
FIG. 7 is a diagram showing the structure of an output circuit of a semiconductor memory device according to a fifth embodiment of the present invention.
Figure 8:
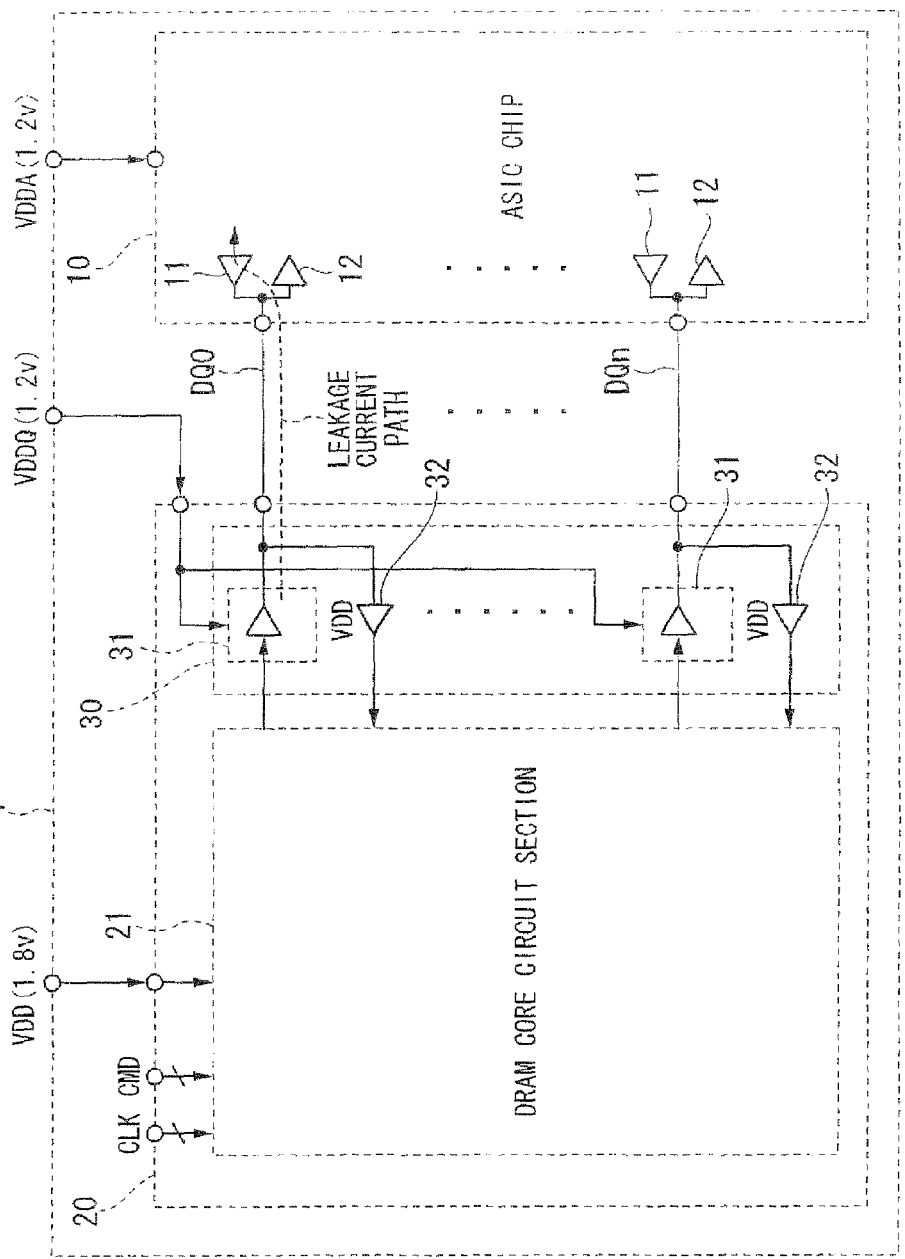
FIG. 8 is a diagram showing a block diagram of a system for a mobile device in which a DRAM is mounted.
Figure 9:
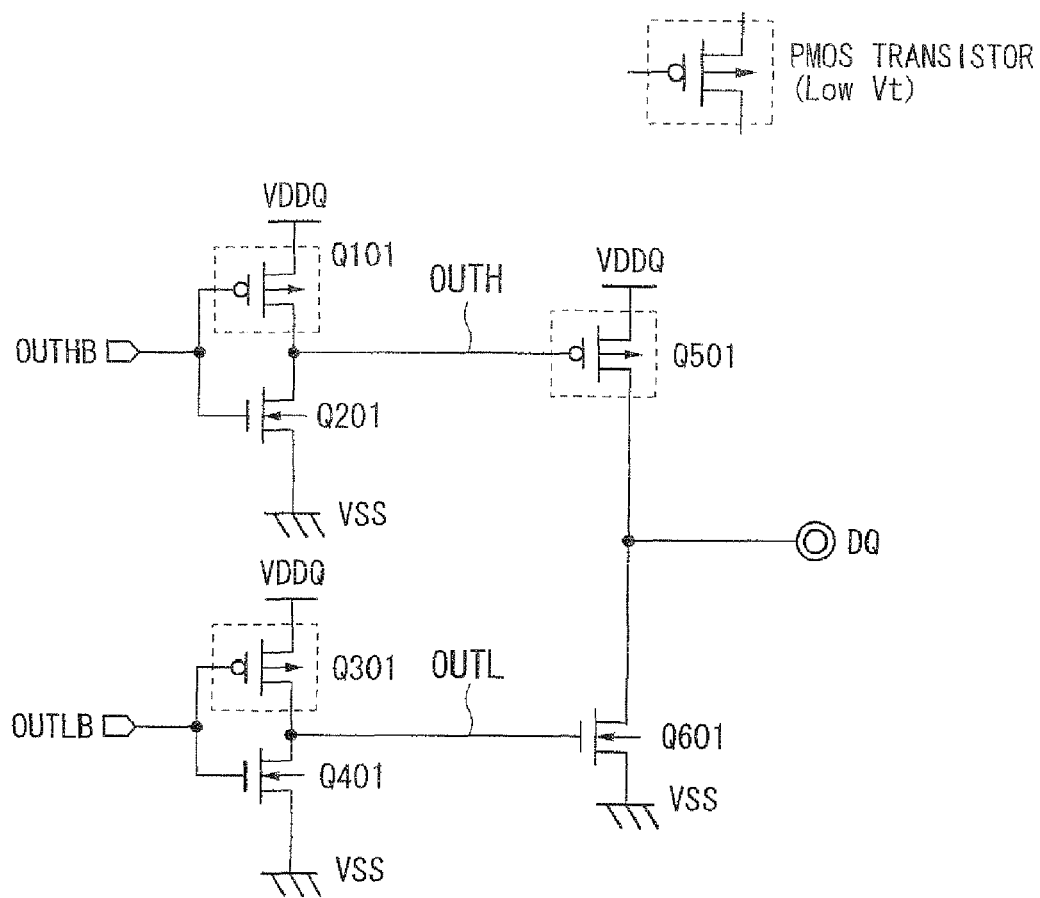
FIG. 9 is a diagram showing the structure of an output circuit of the conventional DRAM shown in FIG. 8.
Figure 10:
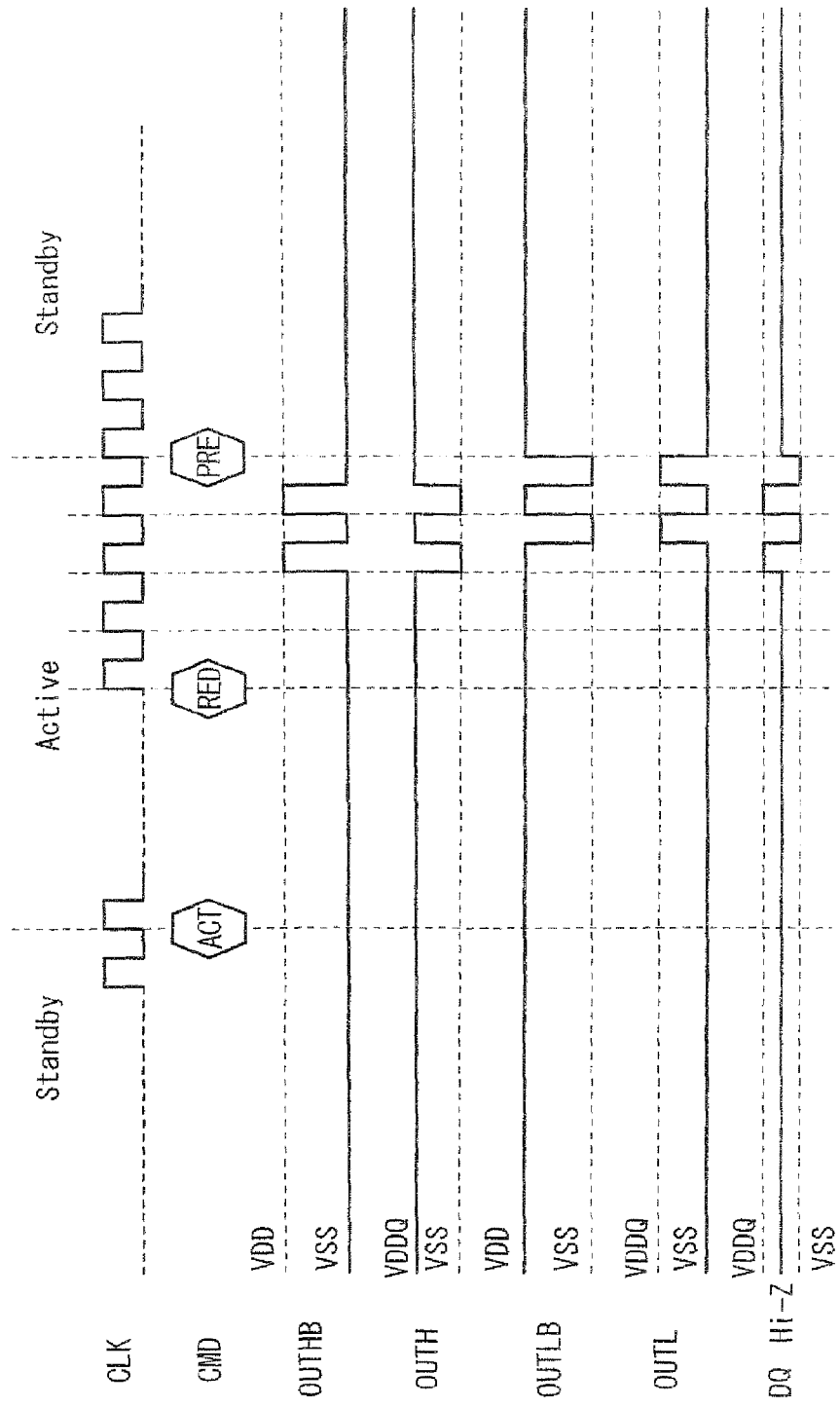
FIG. 10 is a timing chart illustrating an operation of an output circuit of the DRAM shown in FIG. 9.
Figure 11:
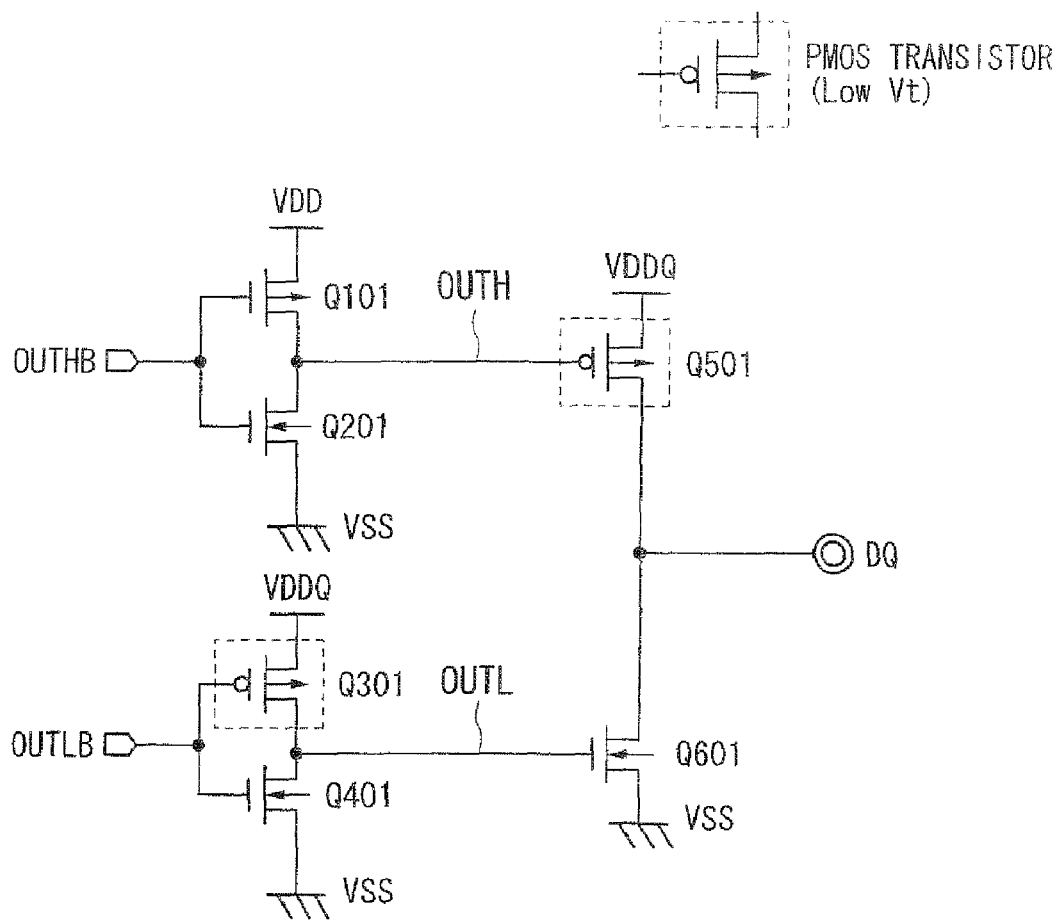
FIG. 11 is a diagram showing a circuit in which a power supply of an inverter section which drives a gate of an outputting transistor has been altered from VDDQ to VDD.
Figure 12:
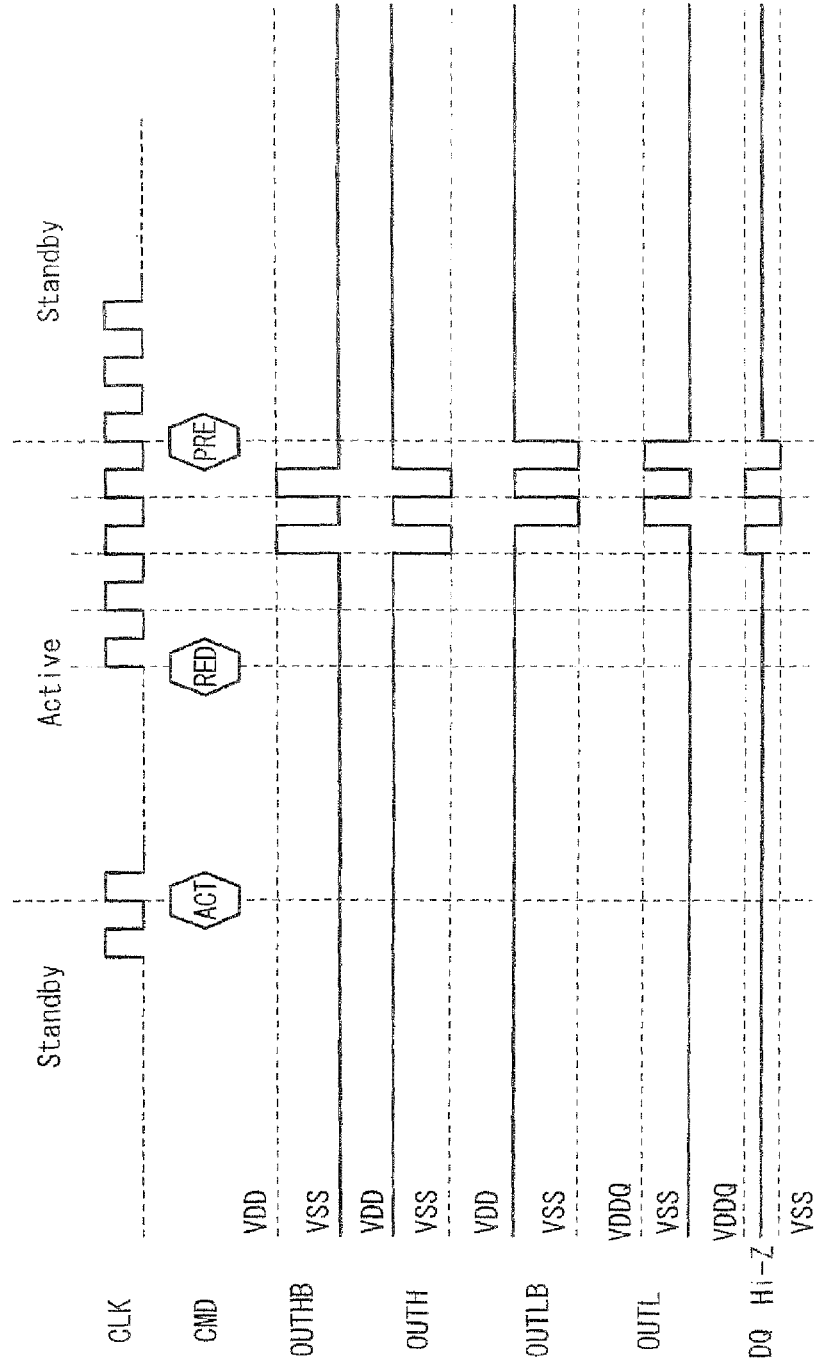
FIG. 12 is a timing chart illustrating an operation of an output circuit of the DRAM shown in FIG. 11.

In the fifth embodiment shown in FIG. 7, the circuit shown in FIG. 6 is used as the basic form with various improvements added thereto. These improvements are described below.

When a state is generated in which only the power supply VDDQ has started up and the power supply VDD has not yet started up, in order to charge the signal OUTH from the power supply VDDQ, the drain terminal of a NMOS transistor Q92 whose source is connected to the power supply VDDQ, is connected to the signal OUTH, and the drain terminal of a NMOS transistor Q102, which is used in order to restrict the level of the signal OUTL to VSS, is connected to the signal OUTL.

The Output from the inverter INV6 which is formed by a PMOS transistor Q112 and an NMOS transistor Q132 is connected to the gate terminal of Q92 and Q102. The source of the PMOS transistor Q112 is connected to the power supply VDDQ, and the gates of Q112 and Q132 are connected to the power supply VDD.

Accordingly, in a state in which only the power supply VDDQ has started up, the output from the inverter INV6 is at the VDDQ level, Q92 and Q102 are ON, the signal OUTH is charged to VDDQ, and the signal OUTL is held at VSS.

Moreover, by adding improvements to the inverter INV4 shown in FIG. 6, and an inverter INV5 is provided in which a PMOS transistor Q32, an NMOS transistor Q142, and an NMOS transistor Q42 are connected in series. The source terminal of the PMOS transistor Q32 is connected to the power supply VDDQ, while the drain terminal thereof is connected to the drain terminal of the NMOS transistor Q142. The source terminal of the NMOS transistor Q142 is connected to the drain terminal of the NMOS transistor Q42. The source terminal of the NMOS transistor Q42 is connected to VSS. A signal OUTLB, which is read data from a memory cell, is input into the gate terminals of the PMOS transistor Q32 and the NMOS transistor Q42. The gate terminal of the NMOS transistor Q142 is connected to the power supply VPP. The signal OUTL is driven by the source terminal of the NMOS transistor Q142.

In the inverter INV5, because the power supply VPP is generated from the power supply VDD, if the power supply VDD is not started up when the power is turned on, the gate terminal of Q142 changes to VSS and Q142 changes to OFF. Because of this, it is possible to prevent the signal OUTL being charged to the VDDQ level by Q32. As a result, even in a state in which only the power supply VDDQ is started up when the power is turned on, it is still possible to prevent both the outputting PMOS transistor Q51 and the outputting NMOS transistor Q61 both being turned on and a large current being generated.

After the power supply VDD and the power supply VDDQ have started up normally, because the gate levels of Q92 and Q102 are at VSS, and Q92 and Q102 are OFF, they do not cause any obstruction to normal operations. Moreover, because the gate level of Q142 is also at the VPP level, neither is there any problem with the operation of the signal OUTL. In the example shown in FIG. 7, because the transitions of the signals OUTH and OUTL to the VDDQ level are both carried out via an NMOS transistor whose gate terminal is at VPP level, an effect is also created of the timing skew between the signal OUTH and the signal OUTL being made to conform.

Note that the above described fifth inverter corresponds to the inverter INV5 that is formed by the PMOS transistor Q32, the NMOS transistor Q142, and the NMOS transistor Q42. Moreover, the above described sixth inverter corresponds to the inverter INV6 that is formed by the PMOS transistor Q112 and the NMOS transistor Q132. In addition, the third gate level setting NMOS transistor corresponds to the NMOS transistor Q142, the fourth gate level setting NMOS transistor corresponds to the NMOS transistor Q92, and the fifth gate level setting NMOS transistor corresponds to the NMOS transistor Q102.

In the description given above, an example is described in which, when on standby, the gate level of the outputting PMOS transistor is set at the level of the power supply VDD which is supplied to the DRAM core circuit section. However, because the effect is obtained in which leakage current is restricted in a standby state provided that the voltage level is higher than the level of the VDDQ that is supplied to the output circuit, it is also possible to use an internal power supply that is generated from the power supply VDD. Furthermore, a description is given of an example in which the gate level of the outputting PMOS transistor changes in direct response to an active command, a read command, or a precharge command (PRE). However, it is not essential for this change to happen in direct response to an external command, and the change may also be triggered by a signal showing an active state (Active) or read state inside the DRAM.

As has been described above, in the respective embodiments of the present invention, when on standby, the gate level of an outputting PMOS transistor is set to a voltage level (i.e., a VDD level) that is higher than the voltage level of the power supply VDDQ that is supplied to the output circuit. Because of this, it is possible to suppress leakage current in a standby state. Moreover, when in an active state, the gate level of an outputting PMOS transistor changes to the level of VDDQ in response to an active command or read command, or in response to the fact that the DRAM state has changed to an active state (Active) or read state, and the output circuit is operated at the VDDQ level. As a result, it is possible to achieve a reduction in current consumption in an active state.

While preferred embodiments of the invention have been described and illustrated above, it should be understood that these are exemplary of the invention and are not to be considered as limiting. Additions, omissions, substitutions, and other modifications can be made without departing from the gist or scope of the present invention. Accordingly, the invention is not to be considered as limited by the foregoing description and is only limited by the scope of the appended claims.

What is claimed is:

1. A semiconductor device comprising:
   a terminal;
   first and second voltage lines supplied respectively with first and second potentials, the first potential being larger than the second potential;
   an output circuit comprising a first transistor of a first conductivity type coupled between the first voltage line and the terminal and a second transistor of a second conductivity type coupled between the second voltage line and the terminal;
   a gate level setting section coupled to the first and second transistors to control levels of control electrodes of the first and second transistors; and
   a core circuit producing information which is to be outputted at the terminal through the gate level setting section and the output circuit, the core circuit comprising a third transistor of the first conductivity type;
   the first transistor having a threshold value that is smaller in absolute value than a threshold value of the third transistor;
   the gate level setting section supplying the control electrode of the first transistor with a third potential that is larger than the first potential in a stand-by mode in which both of the first and second transistors are rendered non-conductive to prevent the information from the core circuit from being outputted at the terminal and with the first potential in an active mode in which one of the first and second transistors is rendered conductive to allow the information from the core circuit to be outputted at the terminal.

2. The semiconductor device according to claim 1, wherein the gate level setting section supplies, in the stand-by mode, the control electrode of the second transistor with a potential that is smaller than the first potential.

3. The semiconductor device according to claim 2, wherein the gate level setting section supplies, in the active mode, the control electrode of the second transistor with a potential that is larger than or equal to the first potential.

4. The semiconductor device according to claim 1, wherein the gate level setting section comprises:
   a first buffer configured with a transistor of the first conductivity type and a transistor of the second conductivity type and supplying the control electrode of the first transistor with a first signal corresponding to the information; and
   a second buffer configured with a transistor of the first conductivity type and a transistor of the second conductivity type and supplying the control electrode of the second transistor with a second signal corresponding to the information.

5. The semiconductor device according to claim 4, wherein the gate level setting section further comprises a fourth transistor and a fifth transistor,
   the transistor of the first conductivity type that configures the first buffer and the fourth transistor that is controlled so as to be rendered electrically conductive in the active mode are coupled in series between the control electrode of the first transistor and the first voltage line, and
   the transistor of the first conductivity type that configures the first buffer and the fifth transistor that is controlled so as to be rendered electrically conductive in the stand-by mode are coupled in series between the control electrode of the first transistor and a third voltage line supplied with the third potential.

6. The semiconductor device according to claim 5, wherein a drain of the fourth transistor and a drain of the fifth transistor are coupled to a source of the transistor of the first conductivity type that configures the first buffer.

7. The semiconductor device according to claim 5, wherein the fifth transistor is a transistor of the first conductivity type.

8. The semiconductor device according to claim 5, wherein a threshold value of the transistor of the first conductivity type that configures the first buffer is equal to the threshold value of the first transistor.

9. The semiconductor device according to claim 7, wherein the fourth transistor is a transistor of the second conductivity type, and
   in the active mode, a control electrode of the fourth transistor is supplied with a fourth potential that is larger than the third potential.

10. The semiconductor device according to claim 5, wherein the gate level setting section further comprises a first resistor coupled in series to the transistor of the first conductivity type that configures the first buffer and to the fifth transistor between the third voltage line and a source of the transistor of the first conductivity type that configures the first buffer.

11. The semiconductor device according to claim 4, wherein the gate level setting section further comprises a sixth transistor coupled to the control electrode of the first transistor and supplying, in the stand-by mode, the control electrode of the first transistor with the third potential.

12. The semiconductor device according to claim 11, wherein the gate level setting section further comprises a second resistor coupled in series to the sixth transistor between a third voltage line supplied with the third potential and the control electrode of the first transistor.

13. The semiconductor device according to claim 11, wherein the gate level setting section further comprises a seventh transistor, and
   the transistor of the first conductivity type that configures the first buffer and the seventh transistor that is controlled so as to be rendered electrically non-conductive in the stand-by mode are coupled in series between the control electrode of the first transistor and the first voltage line.

14. The semiconductor device according to claim 13, wherein the seventh transistor is a transistor of the second conductivity type, and
   in the active mode, a control electrode of the seventh transistor is supplied with a fourth potential that is larger than the third potential.

15. The semiconductor device according to claim 11, further comprising first and second external terminals to which the first and third potentials are respectively supplied from an outside of the semiconductor device independently, the first and second external terminals being respectively coupled to the first voltage line and a third voltage line supplied with the third potential,
   wherein the semiconductor device has a first state at a time power is turned on, the first state indicating a period in which the first potential is supplied from the outside at an earlier time than the third potential, and
   the gate level setting section further comprises: an eighth transistor and a ninth transistor respectively coupled to the control electrode of the first transistor and the control electrode of the second transistor, the eighth transistor and the ninth transistor controlling, in the first state, both the first transistor and the second transistor to render both the first transistor and the second transistor electrically non-conductive; and a control circuit controlling the eighth transistor and the ninth transistor.

16. The semiconductor device according to claim 15, wherein the control circuit comprises:
first and second input terminals respectively coupled to the first and second external terminals; and
an output terminal supplying the eighth transistor and the ninth transistor with a third signal, and
the third signal has first and second logics related to a correlation between the respective potentials of the first and second external terminals.

17. The semiconductor device according to claim 16, wherein the eighth transistor is a transistor of the second conductivity type coupled between the first voltage line and the control electrode of the first transistor, and
the ninth transistor is a transistor of the second conductivity type coupled between the second voltage line and the control electrode of the second transistor.

18. The semiconductor device according to claim 16, wherein the control circuit comprises a tenth transistor of the first conductivity type and an eleventh transistor of the second conductivity type, the tenth transistor and the eleventh transistor being coupled in series between the first voltage line and the second voltage line, respective control electrodes of the tenth transistor and the eleventh transistor being coupled to the third voltage line, respective drains of the tenth transistor and the eleventh transistor being coupled to the output terminal.

19. The semiconductor device according to claim 15, wherein the gate level setting section further comprises a twelfth transistor, and
the transistor of the first conductivity type that configures the second buffer and the twelfth transistor are coupled in series between the control electrode of the second transistor and the first voltage line, a control electrode of the twelfth transistor being supplied with a potential that is larger than or equal to the third potential.

20. The semiconductor device according to claim 19, wherein the twelfth transistor is a transistor of the second conductivity type, and
the control electrode of the twelfth transistor is supplied with a fourth potential that is larger than the third potential.

21. The semiconductor device according to claim 9, further comprising a potential generation circuit coupled to a third voltage line supplied with the third potential, the potential generation circuit generating the fourth potential from the third potential.

22. The semiconductor device according to claim 14, further comprising a potential generation circuit coupled to a third voltage line supplied with the third potential, the potential generation circuit generating the fourth potential from the third potential.

23. The semiconductor device according to claim 20, further comprising a potential generation circuit coupled to a third voltage line supplied with the third potential, the potential generation circuit generating the fourth potential from the third potential.

24. The semiconductor device according to claim 4, wherein a threshold value of the transistor of the first conductivity type that configures the first buffer and a threshold value of the transistor of the first conductivity type that configures the second buffer are smaller in absolute value than the threshold value of the third transistor of the first conductivity type included in the core circuit.

25. The semiconductor device according to claim 1, wherein the gate level setting section independently supplies the respective control electrodes of the first and second transistors with a plurality of potentials.

* * * * *